United States Patent
Tsongas et al.

(10) Patent No.: US 8,914,261 B2
(45) Date of Patent: *Dec. 16, 2014

(54) SYSTEMS AND METHODS FOR EMPLOYING AUTOMATED DATA ANALYSIS TO DEFINE ZONES FOR DEVICE PLACEMENT IN AN OPERATING EVIRONMENT

(75) Inventors: Jason C. Tsongas, Rochester, NY (US); Matthew O. Scrafford, Fairport, NY (US)

(73) Assignee: Xerox Corporation, Norwalk, CT (US)

( * ) Notice: Subject to any disclaimer, the term of this patent is extended or adjusted under 35 U.S.C. 154(b) by 202 days.

This patent is subject to a terminal disclaimer.

(21) Appl. No.: 13/541,421

(22) Filed: Jul. 3, 2012

(65) Prior Publication Data

US 2014/0012545 A1    Jan. 9, 2014

(51) Int. Cl.
| | |
|---|---|
| *G06F 17/50* | (2006.01) |
| *G06Q 10/04* | (2012.01) |
| *G06Q 50/16* | (2012.01) |
| *G01C 21/32* | (2006.01) |

(52) U.S. Cl.
CPC .......... *G06Q 10/043* (2013.01); *G06F 17/5004* (2013.01); *G06Q 50/16* (2013.01); *G01C 21/32* (2013.01)
USPC ............................................................ 703/1

(58) Field of Classification Search
CPC .......................... G06F 17/5004; G06F 2217/02
USPC ............................................................ 703/1
See application file for complete search history.

(56) References Cited

U.S. PATENT DOCUMENTS

| | | | | |
|---|---|---|---|---|
| 8,099,237 | B2 * | 1/2012 | Mays et al. | 701/434 |
| 8,665,488 | B2 * | 3/2014 | Merriam et al. | 358/1.9 |
| 2010/0324950 | A1 * | 12/2010 | Merriam et al. | 705/7 |

OTHER PUBLICATIONS

Scrafford et al.; U.S. Appl. No. 13/194,228, filed Jul. 29, 2011, "Method and Apparatus for Determining Placement of Devices Based on a Building Layout".

* cited by examiner

*Primary Examiner* — Aniss Chad
(74) *Attorney, Agent, or Firm* — Ronald E. Prass, Jr.; Prass LLP

(57) ABSTRACT

A system and method are provided to a placement and optimization process for a plurality of common use devices in an operating environment according to actual users' employment of the common use devices, and actual needs for placement of certain common use devices in the operating environment. The disclosed system and method add a level of automation that may be used to collect use data for the common use devices according to a specified scheme in order to produce a more robust, flexible and updatable scheme for confirming an initial optimal layout for the common use devices and for providing a basis for updating that initial optimal layout over time to account for unforeseen errors in the initial assessment or changes in workflow as mandated by changes in the operating environment and user preferences.

16 Claims, 4 Drawing Sheets

SYSTEMS AND METHODS FOR EMPLOYING AUTOMATED DATA ANALYSIS TO DEFINE ZONES FOR DEVICE PLACEMENT IN AN OPERATING EVIRONMENT

This application is related to U.S. patent application Ser. No. 13/194,228, filed Jul. 29, 2011, entitled "Method And Apparatus For Determining Placement Of Devices Based On A Building Layout," the disclosure of which is hereby incorporated by reference herein in its entirety.

BACKGROUND

1. Field of Disclosed Subject Matter

This disclosure relates to systems and methods for combining a space floor plan map indicating positions of existing output devices with automatically-collected user affinity data for each of the existing output devices to confirm, review and/or update a placement plan for the existing output devices and for any output devices that may be added in a workspace environment in which the output devices are operated.

2. Related Art

Many vendors, and service and system providers, undertake efforts to aid customers in optimizing work flows in modern office environments. These optimization efforts require analysis of a number of variables and individual characteristics of the office workspace environment, which will be referred to generically in this disclosure as an "operating environment." Individual user workstations associated with individual users are placed according to a certain prescribed scheme. Separately, common use devices, such as all manner of output devices including output image forming devices, are networked to a plurality of the individual user workstations for use. Because these common use devices are accessed by some number of users, these devices should be optimally placed for appropriately easy access by those users. Placement of the common use devices should be intelligently undertaken in a manner that balances use of the common use devices and accounts for convenient access by the plurality of users that are intended to employ one or more particular common use devices.

Managed service providers that provide the common use devices are among the vendors that often offer basic floor plan mapping applications for placement of the common use devices under their management. Building floor plans are often imported from myriad sources and are consulted to assess an overall building layout and to choose a "best guess" for at least the initial placement of the common use devices accounting for a basic level of access to the devices such as, for example, avoidance of physical obstructions. These efforts may attempt to account for "planned" use by the plurality of users deployed in the operating environment. The conventional process of basic floor plan mapping tends to be time consuming and subjective, and relies on a great deal of human interaction to understand a relationships between, for example, (1) the existing common use devices deployed in the operating environment and (2) the users working in the operating environment. This process, by its very nature, tends to be error prone causing a large percentage of initial layout schemes, whether provided by vendors or performed by customers using vendor tools, in the managed service space to need to undergo significant revision soon after initial device deployment.

Previous work has been directed at adding a level of analysis to the efforts by defining zones within the operating environment. This process groups users, and uses, of common use devices according to a first level analysis including an analysis of uses for certain zones within an operating environment and a density of a user population associated with each zone. This first level analysis removes some of the difficulties incumbent in the purely manual efforts. The first level analysis tends to make the initial deployment of the common use devices more robust. The efforts that include this first level analysis remain fairly rigid, however, and difficult to update. Under these types of schemes, common use devices are often placed within the operating environment and statically left in place according to the initially analyzed deployment regardless of changes in operations or user configurations within the operating environment. These basic operations are valuable in accounting for operating conditions as they exist at a particular point in time, but provide little ability by which to confirm or update optimal positioning of common use devices within defined zones, or between zones, as an overall laydown of the operating zones may change with changes in operating conditions and other factors.

Also, without detailed review and human intervention, often requiring the aid of a building manager or other individual that is tasked with aiding in the optimizing of the human engineering incumbent in the space design, it is difficult to account for all of the conditions of the operating environment that may affect use, and therefore placement, of particular common use devices within particular zones. For example, take a case where a zone may be designated as a semi-secure or secure area that is accessible by only a limited number of users. Such a designation of a particular zone may not be readily apparent simply by reviewing a floor plan map. Such a secure area, for example, may need to be defined as its own zone in order that devices may be optimally placed for use by only those individuals who may access that zone.

SUMMARY OF THE DISCLOSED EMBODIMENTS

In view of the above, it may be beneficial to provide a system and a method that further automate a placement and optimization process according to actual users' employment of common use devices, and actual needs for placement of certain common use devices in an operating environment. In this manner, allocation to, and placement of, the common use devices in specific zones, which may be defined structurally or functionally, can be optimized by employing a system that tracks user-specific parameters for use of the common use devices in support of a more optimal workflow, and more efficient use of common use resources, in an operating environment.

U.S. patent application Ser. No. 13/194,228 (the 228 Application), commonly assigned and incorporated by reference, describes a method and apparatus for determining proper locations for placement of devices using a building layout. The method described in the 228 Application includes augmenting an existing building layout with zones to designate user accessibility rules along with definitions of barriers to user flow and density of users. When the zones and density have been defined, the overall placement of devices in the method described in the 228 Application may be automatically generated for an optimal quantity and location of devices.

This disclosure takes the concept provided in the 228 Application and adds a level of automation that may be used to collect use data for the common use devices according to a specified scheme in order to produce a more robust, flexible and updatable scheme for confirming an initial optimal layout for the common use devices and for providing a basis for updating that initial optimal layout over time to account for, for example, unforeseen errors in the initial assessment or changes in workflow as mandated by changes in the operating environment and user preferences.

Exemplary embodiments may provide an automatically updatable system and method by which specific placement of common use devices, such as output image forming devices, in an operating environment, such as an office workspace, may be confirmed and/or updated, according to automatically-collected data on user preferences, particularly as operating conditions change.

Exemplary embodiments may monitor users' existing use of particular common use devices, such as by monitoring print activity to a plurality of printers, to provide inputs to an optimization algorithm, model or scheme in order to specify optimal placement of a plurality of common use devices within a plurality of zones in the operating environment.

Exemplary embodiments may provide an ability to track, for a specified period of time, user activity with regard to individual output devices in order to "map" that activity as an overlay to a building floor plan map in order that optimization of placement of existing and added output devices may be undertaken on a real-time basis by referencing the data provided by the tracking Exemplary embodiments may provide a correlation between individually-directed print activities, and printers to which that print activities are directed, for a plurality of users in an effort to optimize allocation and placement of the printers within the operating environment in which the plurality of users work.

Exemplary embodiments may highlight ineffective printer placement.

Exemplary embodiments may cause a specified zone, for example within a zone, to be separately defined based on analysis of collected use data.

Exemplary embodiments may provide a capacity to respond to a changing layout of the operating environment or changing laydown of the output devices being employed within that operating environment as physical and functional characteristics or requirements for the operating environment change.

Exemplary embodiments may optimize placement of output devices based on a real-time usage map to determine usage schemes for plurality of output devices by a plurality of users in the operating environment.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed systems and methods for automated generation of a placement plan for existing output devices, and for any output devices that may be added, in an operating environment for the output devices will be described, in detail, with reference to the following drawings, in which.

DETAILED DESCRIPTION OF THE DISCLOSED EMBODIMENTS

Figure 1:
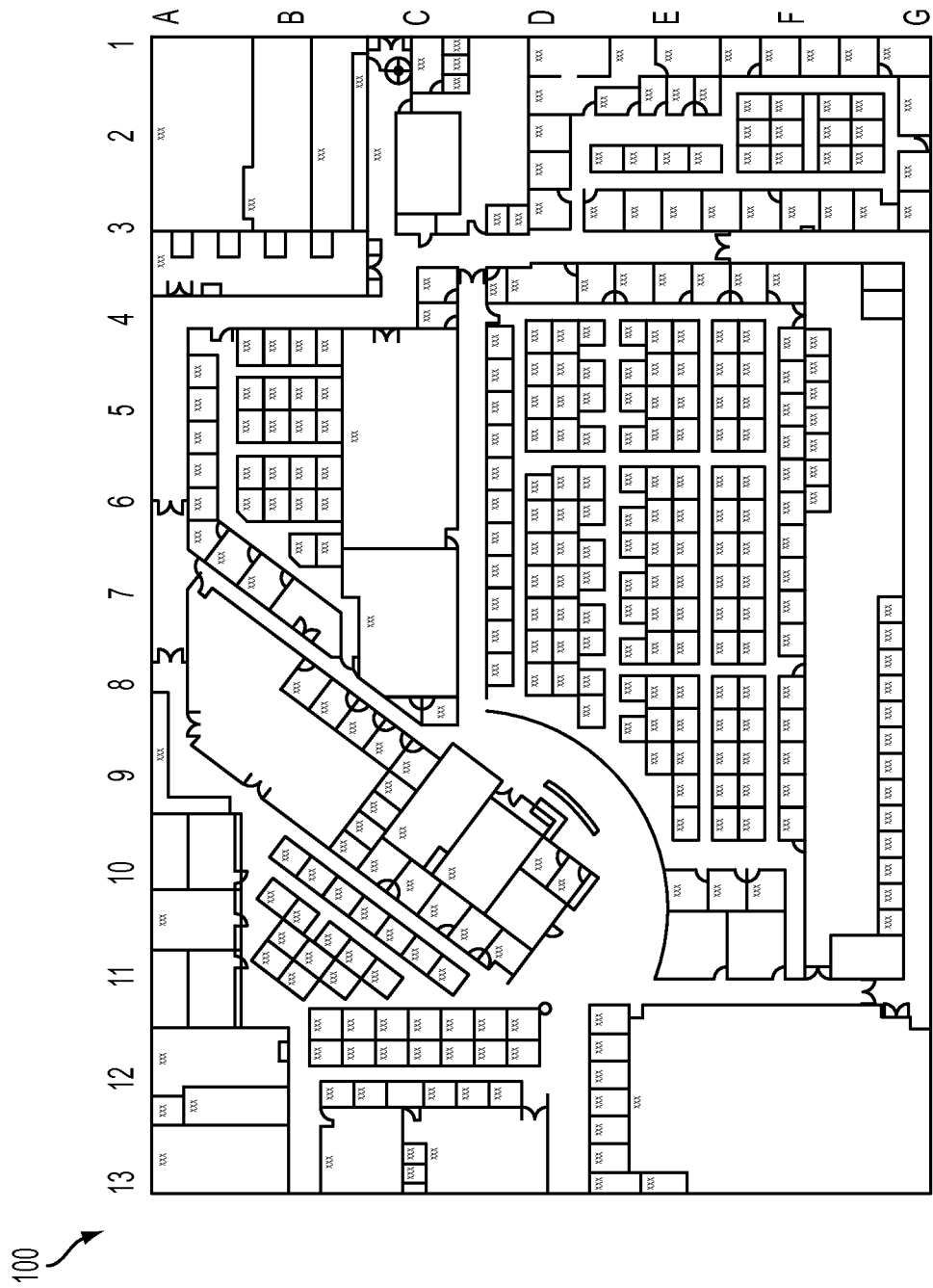
FIG. 1 illustrates a generic representation of floor plan map, which may constitute a map layer, for an operating environment that may be usable by the systems and methods according to this disclosure.

The systems and methods for generating a placement plan for the existing output devices, and for any output devices that may be added, in an operating environment for the output devices in this disclosure will generally refer to this specific utility or function for those systems and methods. Exemplary embodiments described and depicted in this disclosure should not be interpreted as being specifically limited to any particular configuration of the described elements, or as being specifically limited to any particular intended use. Any advantageous combination of the disclosed features with legacy workspace design and definition concepts and schemes that may benefit from, for example, the described automated data collection efforts are contemplated as being included in this disclosure.

Specific reference to, for example, common use (output) devices as that term is commonly used throughout this disclosure is intended to make non-limiting reference common electronic and image forming devices in a networked workspace operating environment. These devices are those to which a plurality of users may forward work product to in order that the work product is output locally in hard copy. These terms should not be considered as limiting to any particular configuration of those respective devices, as described. The terms "output image forming device," and the like, as referenced throughout this disclosure are intended to refer globally to a class of devices and systems that carry out what are generally understood as printing and image forming functions as those functions would be familiar to those of skill in the art.

When undertaking an optimization scheme, different zones may be defined according to the systems and methods disclosed in the 228 Application to designate areas according to specific functions, user densities or other characteristics. Zones may be identified as, for example, secure areas, common areas, support areas and work areas. Zones may separately be identified as certain exclusion areas where, for example, common use (output) devices including printers cannot be placed. The zones may have a predefined or specified set of rules for access which may be analyzed in assisting placement of the common use devices based on user access. With these categories of information, augmented with user density information, an initial estimate of an optimal placement for the common use (output) devices may be generated using an automated scheme for placement of devices on a map of the workspace environment according to a specified set of rules, or otherwise may be generated using a directed manual placement for the common use (output) devices on the map augmented with information and recommendations to an operator that may specify some objective measure of convenience for users or some obstruction avoidance metric.

The system described in the 228 Application accounts for the above and includes an ability to define movement criteria between zones, which would allow for improved placement of the common use (output) devices. These considerations may include details regarding a user with Badge Access A that may not be able to cross (or print) outside a particular zone thereby defining a requirement for multiple printers to support the needs of users with Badge Access A. This capacity may be particularly useful in instances where areas defined for Badge Access A may be split by another zone.

The scheme disclosed in this application combines a space floor plan map indicating positions of existing common use (output) devices with automatically-collected user affinity data for each of the common use (output) devices to review and update a placement plan for the existing devices and for added devices in the operating environment for the devices. The analysis of the data provided by this scheme may correlate patterns of behavior to derive affinities that exist between individual common use (output) devices. The affinity between common use (output) devices may represent a measure of their common use by individual users, or sets of users, in the workspace. This affinity data may be presented in a usable form to instruct an operator regarding the placement of new devices or a rearrangement of existing devices when performing an optimization of existing devices based on changing patterns of use and/or changing workplace functions. This scheme may assist in understanding the relationship between existing devices on the floor plan map, possible separations/barriers between locations, security restrictions and other like operating and structural constraints that may impede workflow.

Real-time data collection of a specific data set and real-time analysis of the data in order to provide an optimal layout for the common use (output) devices in an operating environment may be provided. For example, data may be collected and it may be determined that a particular printer, or group of printers, which is/are thought to be integrated within a particular zone, is/are only employed locally by a small specified number of users rather than by the user population at large. This information may assist layout designers at specifying, for example, a zone within a zone where only a small number of users share a particular output device, or set of output devices, thereby defining specific requirements for support in that zone. The optimization plan may determine that it is appropriate to leave a particular output device dedicated to that small group of users. Otherwise, it may be determined that some shifted placement of one or more of the other output devices commonly located within the particular zone may provide an ability to remove an underused output device that is used by only a small group of users within a larger zone.

The above scenario may arise, for example, in instances where a particularly secure area is located within a larger zone. It may become obvious that there is some specified reason why only the small group of users employs a particular output device, or set of output devices. Intelligent decisions may then be made by workflow coordinators and placement designers in determining an optimal layout for a specified number of output devices within the operating environment.

The disclosed embodiments concern the placement of one or more devices using a building layout such that the placement of the devices can be achieved in an efficient manner. The efficient placement of the devices may reduce unnecessary movements or relocations of the devices resulting in better customer satisfaction and overall installation costs, especially in instances when the placement of the devices is under an installation contract.

FIG. 1 illustrates a generic representation of floor plan map 100, which may constitute a map layer, for an operating environment that may be usable by the systems and methods according to this disclosure. Floor plan map 100 may be generated by a floor planning application based on a basic building layout. The floor planning application may include an interface to enable an operator to import the basic building layout into other applications. The interface may include features to enable the operator to input floor plan configurations and to generate the floor plan map 100. As shown, the floor plan map 100 may include a horizontal legend (e.g., numbers from 1 to 13) and vertical legend (e.g., letters from A to G). The horizontal legend and the vertical legend form a matrix or grid to help the operator to identify specific locations in the floor plan map 100 based on an intersection of a vertical line and a horizontal line. The floor plan map 100 may be particularly useful in identifying a specified grid coordinate location for each of a plurality of user workstations and for each of a plurality of common use (output) devices that are located in the operating environment represented by the floor plan map 100.

Figure 2:
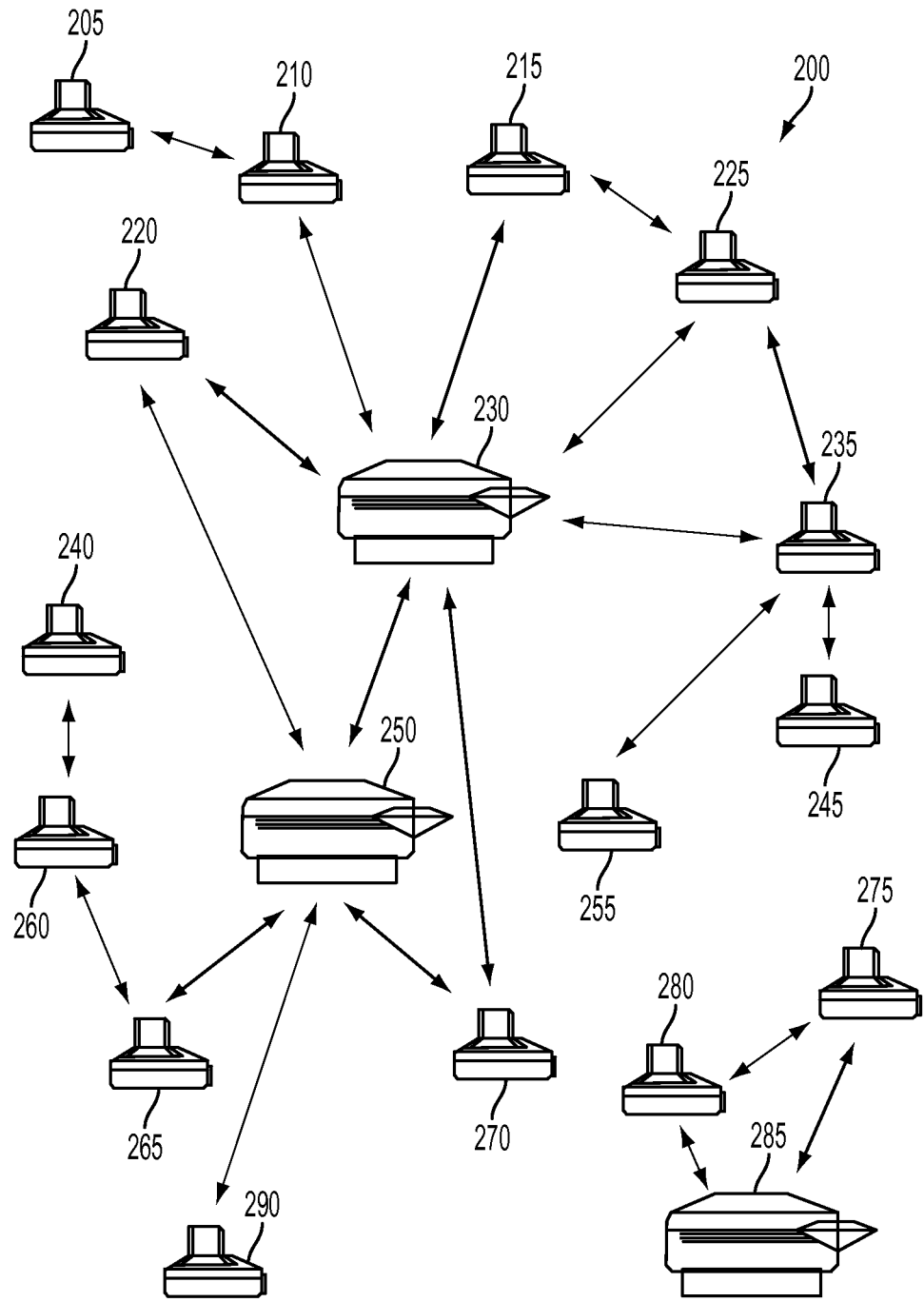
FIG. 2 illustrates an embodiment of an affinity model for a plurality of common use (output) devices that may be generated, analyzed and employed to assess and update a placement plan for the common use (output) devices using the systems and methods according to this disclosure.

FIG. 2 illustrates an embodiment of an affinity model 200 for a plurality of common use (output) devices that may be generated, analyzed and employed using the systems and methods according to this disclosure. As shown in FIG. 2, the affinity model 200 may monitor use of a plurality of different types of common use (output) devices 205-290 in an effort to establish relative levels of relationships between use of the common use (output) devices 205-290. An exemplary layout of such relationships is shown in FIG. 2, with an existence and a thickness of particular arrows between pairs of devices being used to indicate affinities and levels of common use. Mathematical models may be used to represent print job redirections, which enable additional automation possibilities by applying more complex and rigorous analysis and representation in the generation of the affinity model 200. It should be noted that color codes may be alternatively or additionally employed to show levels of affinity, to replace or supplement the depicted relative line thicknesses. Also, thresholds may be established to define levels of relative affinities.

The disclosed scheme represents an adaptive procedure based on a selected dataset to track and reference such as, for example, Print Job Tracking Data. This dataset is dynamic and may be extended or renewed by print job submissions thereby making it adaptable to a workspace print environment. The affinity tracking scheme then may provide a capacity to detect events like a printer moving to a different location (change of floor/building scenario) or a user moving to a different location (change of office scenario).

A visual representation such as that shown in FIG. 2 may provide a readily accessible pictorial tool to display, for example, a redirection history associating users to print devices by showing output devices 205-290 as endpoint nodes and displaying the weighted/colored lines (with or without arrows) representing the propensity for users employing a specific printer to also employ at least one other related printer.

With the automated collection and storage of information that is represented by a depiction such as that shown in FIG. 2, the actual and relative affinities can be used to determine optimum device positioning in the workspace environment, particularly with respect to user workstations for the users that employ particular combinations of output devices.

FIG. 2 shows the affinities of users using output devices 230 and 250 are related to use of multiple other output devices that exist in the depicted infrastructure in varying degrees. This relationship indicates that a large number of users employing other output devices also employ output devices 230 and 250, which are likely capable of being used for many jobs that might be output elsewhere. This affinity data may be used to establish an importance of each device in a group, which could be used to target service priority, as well as to specify an optimal placement of the device for access by a majority of users.

Using the affinity data methods, the collected data on device affinity can be used to establish zones for devices on a floor plan map, supplementing the methods described in the 228 Application. In a first illustrative example, if a device in one area has no other device related, it can be determined that the users that have access to that device may not have access to other device. In a second illustrative example, if two device have a large affinity between them, it may be determined that a large number of users in the area that contains both devices may generally access both devices without restrictions. This would define that the area surrounding both devices would likely be a single zone. In a third illustrative example, if two devices have a small affinity between them, it can be determined that a small numbers of users use both devices. This would help in determining there are two zones. Further, the security between the two zones could be determined with job data analysis. Such a situation as is discussed in the third illustrative example may be shown in FIG. 2 where analysis and depiction of affinity data for what was considered a single overall zone may reveal that a particular group of devices, e.g., output devices 275,280,285, are employed with relationships to each other in varying degrees, but not to any of the other devices in the zone. As such, the analysis provides information that may lead to definition of a separate zone within a particular zone, or a separate zone altogether.

Data from the affinity analysis may be virtually overlaid, or actually overlaid in a visual representation on a floor plan map, such as that shown in FIG. 1, to provide a representation of various zones according to, for example, a color-coded legend. Different zones (colors) may be automatically generated using the collected affinity information. Employing the data in this manner may provide a capacity of further fine tuning of the zones, if needed. This application would assist in the definition of the zones rather than relying on the current, somewhat more error prone method of "guessing" on placement of common use (output) devices and configurations of separate zones. This analysis may result in the definition of smaller zones where all the users in the same area have access to all the devices. For example, if groups of printers in a particular zone do not share an affinity with a number of printers in the zone, as shown above, it could mean that the zone is too big and should be treated as multiple zones instead of a single large zone.

In an exemplary embodiment employing the systems and methods according to this disclosure to analyze a workflow, for example, all job data may be tracked for a particular site to be optimized in a given month prior to undertaking an optimization. This job data tracking may allow for collecting enough data to determine an affinity between all, or a specific group, of the common use (output) devices at the site that execute the job data according to a specified operating environment encompassing the devices being tracked. Following this data collection, an analysis may be undertaken that yields an optimization for placement of a plurality common use (output) devices. This optimization may be visually represented by placing an indication for an optimal location of each of the common use (output) devices on an annotated floor plan map. This scheme facilitates adding, and optimally placing, common use (output) devices to map zones as the additional devices become available.

Once the initial optimization and placement process is completed, job data collection and tracking efforts may continue. Shifts in user behavior with respect to the common use (output) devices within zones, or across zones, may be highlighted for an administrator to modify optimal placement of the current collection of common use (output) devices. The administrator, which may be an individual operator for manual operations, or a routine of automated steps for automated operations, may review the data and determine if an update to the location of any of the devices warranted.

The disclosed schemes, whether partially or fully automated, may provide a novel capacity to automatically define different use zones on a floor plan by using relationships between devices, such as printers, based on tracked use behavior. Beneficial results attributable to the proposed scheme may include: improved customer satisfaction through an improved initial placement of common use (output) devices in a workspace; cost reduction to customers and service providers by providing an automated process for assessing higher fidelity real-time inputs; and "right sizing" of contracts for installation of common use (output) devices.

Figure 3:
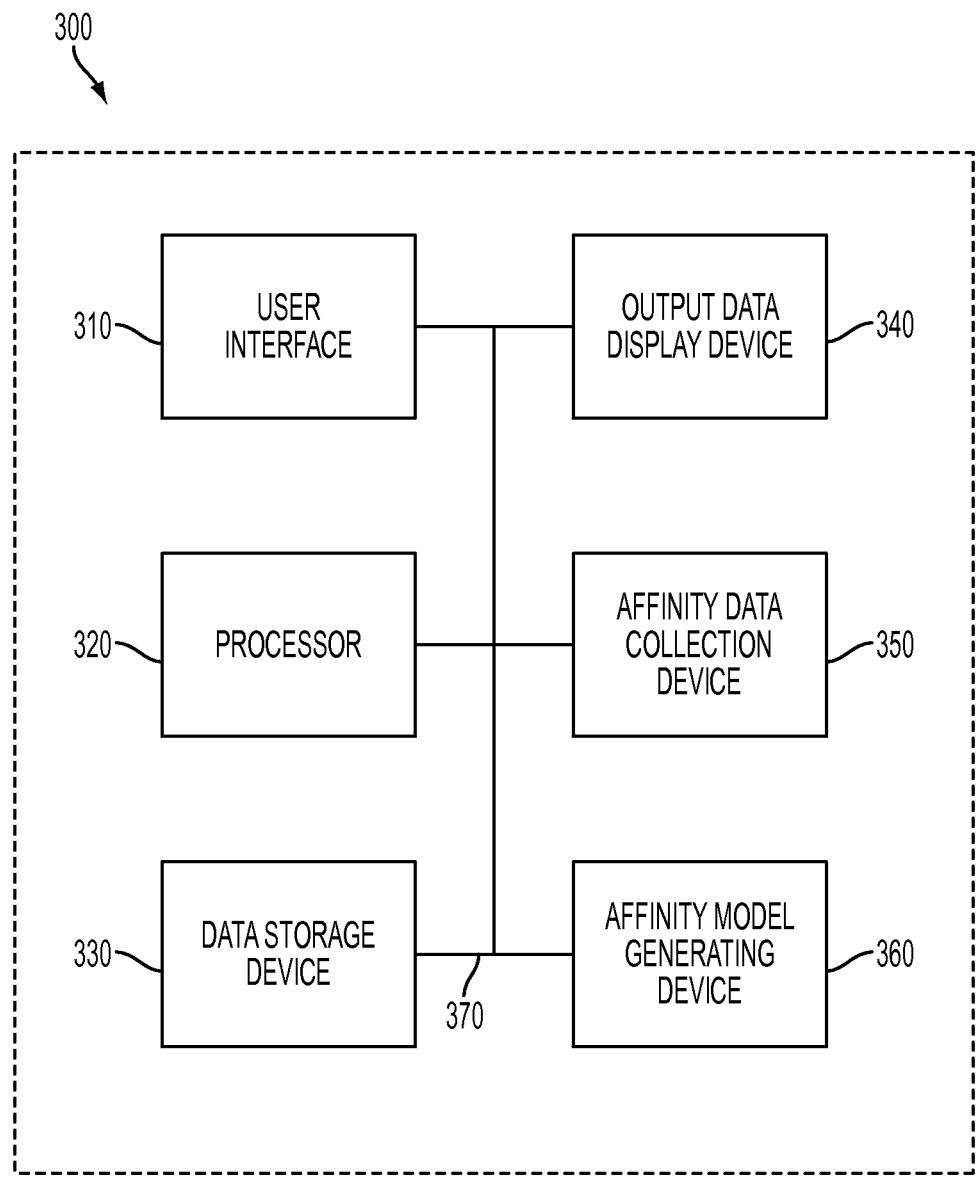
FIG. 3 illustrates a block diagram of an exemplary system for employing affinity data to generate a placement plan for common use (output) devices according to this disclosure.

FIG. 3 illustrates a block diagram of an exemplary system 300 for employing affinity data to generate a placement plan for common use (output) devices according to this disclosure. The exemplary system 300 may be, for example, a standalone system that may be installed as part of a network monitoring system or a standalone system that may be placed in communication with a network via an automated data exchange interface. The exemplary system 300 may alternatively, or additionally, be integrated as a function of a network administration workstation.

The exemplary system 300 may include a user interface 310 by which a user, such as, for example, a system administrator, a system optimizer, a device manger or other like entity, may communicate with the exemplary system 300. The user interface 310 may be configured as one or more conventional mechanisms that permit a user to input information to the exemplary system 300. The user interface 310 may include, for example, an integral or attached keyboard, a pointing device or a touchscreen with "soft" buttons for communicating commands and information to the exemplary system 300. The user interface 310 may alternatively include a microphone by which a user may provide oral commands to the exemplary system 300 to be "translated" by a voice recognition program or otherwise. The user interface 310 may otherwise include any other like device for user operation of, and data exchange with, the exemplary system 300. A user may make inputs via the user interface 310 to access, for example, information regarding a workspace configuration that may be stored in a usable format, to include as a floor plan map in the manner depicted, for example, in FIG. 1. The workspace configuration information may include an indication as to where certain common use (output) devices are placed, or are to be placed, in the workspace environment.

The term "user interface" in the context of this application should also be understood to include an automated external data interface that may provide data communication to a monitored network, and may otherwise be used to communicate information between the exemplary system 300 and the monitored network with which the exemplary system 300 may be placed in wired and/or wireless communication.

The exemplary system 300 may include one or more local processors 320 for individually undertaking the processing and control functions that are carried out by the exemplary system 300. Processor(s) 320 may include at least one conventional processor or microprocessor that interprets and executes instructions and processes outgoing and incoming data via different communication links in the exemplary system 300 according to the methods of this disclosure.

The exemplary system 300 may include one or more data storage devices 330. Such data storage device(s) 330 may be used to store data, and operating programs or applications to be used by the exemplary system 300, and specifically the processor(s) 320. Data storage device(s) 330 may include a random access memory (RAM) or another type of dynamic storage device that stores information and instructions for execution by the processor(s) 320. Data storage device(s) 330 may also include a read-only memory (ROM), which may include a conventional ROM device or another type of static storage device that stores static information and instructions for execution by the processor(s) 320. The data storage device(s) 330 will generally be those that are integral to the exemplary system 300. Otherwise, the data storage device(s) 330 may include a remote data storage device external to the exemplary system 300 that is in wired or wireless communication with the exemplary system 300 specifically for storing information that may include floor plan maps for workspaces under review The exemplary system 300 may include at least one output data display device 340 that may be configured as one or more conventional mechanisms that display information to a user of a system such as the exemplary system 300 for operation of the exemplary system 300 in its various operating modes, or otherwise for displaying, for example, results of an affinity analysis undertaken by the exemplary system 300 and/or other indications that may be beneficial to a user in establishing communications with and operating the exemplary system 300.

The exemplary system 300 may include one or more affinity data collection devices 350. The affinity data collection device(s) 350 may be used by the exemplary system 300 to track operating data for a plurality of common use (output) devices in an operating environment. Input may be made to the exemplary system 300 via the user interface 310 to identify, for example, a plurality of common use (output) devices to be tracked and a period of time over which the tracking of the specified devices may be undertaken. Data may be collected and stored in one or more of the data storage devices 330 for analysis in generating a real-time affinity profile for the devices over the specified period of time. An ability of the exemplary system 300 to collect the specified affinity data via the affinity data collection device 350 may facilitate a common use (output) device placement scheme according to this disclosure.

The exemplary system 300 may include an affinity model generating device 360, which may operate in conjunction with the other elements of the exemplary system 300, to analyze the affinity data collected by the affinity data collection device 350 for generation of a placement plan that may be intended to optimize the placement of the common use (output) devices in the operating environment under scrutiny by the exemplary system 300. The affinity model generating device 360 may generate the affinity model for display on the output data display device 340 as an unconnected device laydown in a form such as that shown in FIG. 2, or may preferable associate the generated model with, for example, a floor plan map of the operating environment such as that shown in FIG. 1, by identifying, for example, a preferred location for each common use (output) device relative to a group of users/user workstations. Having generated an affinity model, the affinity model generating device 360 may direct the processor 320 to optimize the placement of the common use devices under scrutiny according to a set of rules that may be defined by a user, input to and/or stored in the exemplary system 300 and accessed by the exemplary system 300 as appropriate to execute an optimization of placement of the plurality of devices according to the disclosed methods.

All of the various components of the exemplary system 300, as depicted in FIG. 3, may be connected by one or more data/control busses 370. The data/control bus(ses) 370 may provide internal wired or wireless communication between the various components of the exemplary system 300, as all of those components are housed integrally in the exemplary system 300, or as certain of the elements may be remotely housed and be in wired or wireless communication with other components of the exemplary system 300.

It is anticipated that the various disclosed elements of the exemplary system 300 may be arranged in combinations of sub-systems as individual components or combinations of components, but that, regardless of the specific configuration, all of the depicted components may be integral to a single unit that is the exemplary system 300. Otherwise, individual components or combinations of components may be remotely dispersed in multiple locations and in wired or wireless communication with other of the individual components of the exemplary system 300 that may communicate with those components. In other words, no specific configuration as an integral unit or as a support unit, or as several units or sub-systems widely dispersed, for the exemplary system 300 is to be implied by the depiction in FIG. 3.

Figure 4:
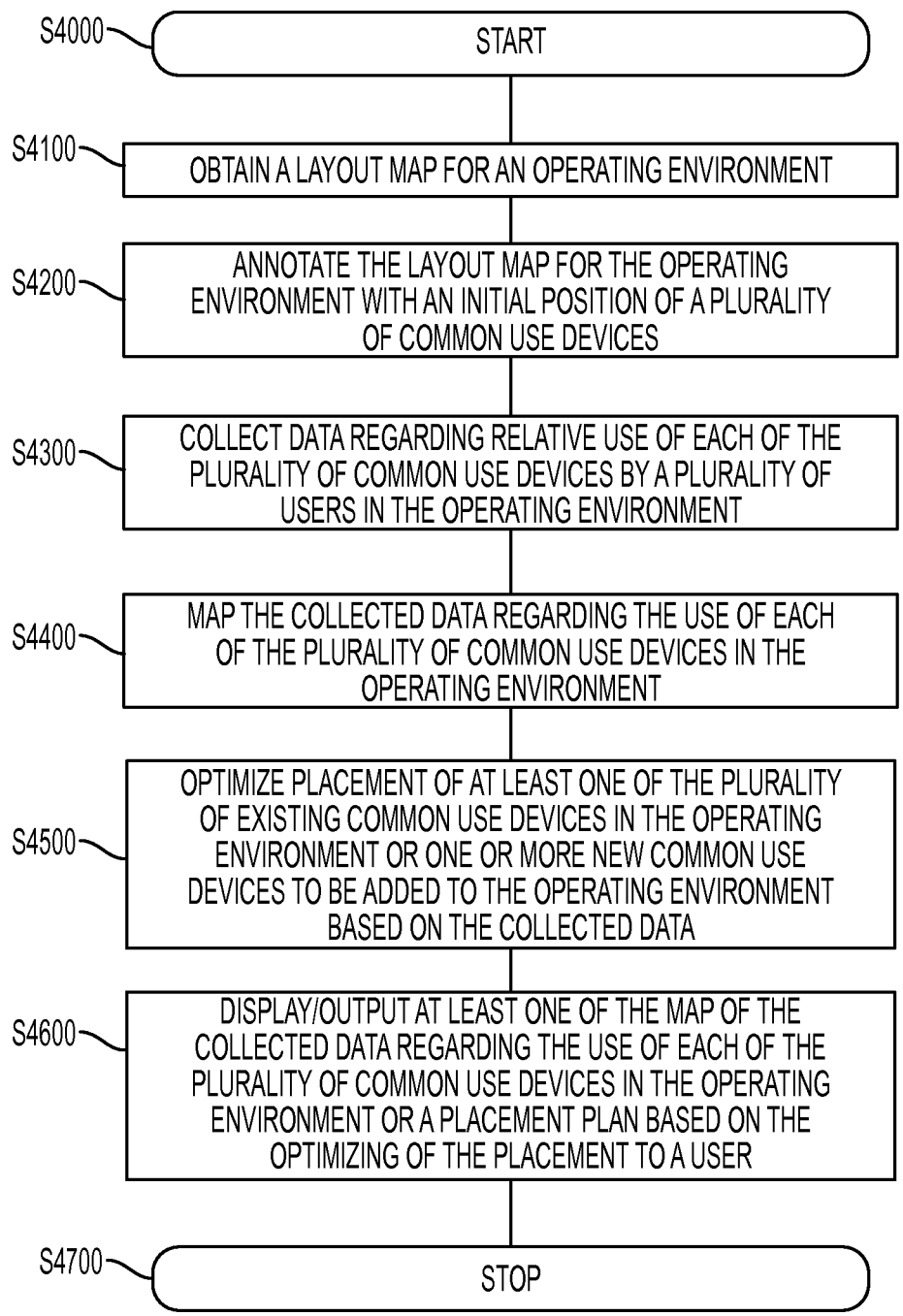
FIG. 4 illustrates a flowchart of an exemplary method for implementing a scheme for affinity data collection, analysis and use to generate a placement plan for common use (output) devices according to this disclosure.

FIG. 4 illustrates a flowchart of an exemplary method for implementing a scheme for affinity data collection, analysis and use to generate a placement plan for common use (output) devices according to this disclosure. As shown in FIG. 4, operation of the method commences at Step S4000 and proceeds to Step S4100.

In Step S4100, a layout map, such as a floor plan map, for an operating environment may be obtained. The layout map may be recovered, for example, from a data storage device in the network under scrutiny. Otherwise, the layout map may be uploaded by a user via a user interface. Operation of the method proceeds to Step S4200.

In Step S4200, the layout map may be annotated or otherwise referenced to indicate an initial position of a plurality of common use (output) devices in the operating environment. It is this plurality of common use (output) devices that may be analyzed by collecting data regarding their use by the plurality of users working in the operating environment. Operation of the method proceeds to Step S4300.

In Step S4300, data may be collected regarding relative use of each of the plurality of common use (output) devices by a plurality of users of the operating environment. This data collection effort may be according to a user-specified number of common use (output) devices, or otherwise may be directed at an entire population of the common use (output) devices in a particular operating environment. The data collection effort may also be according to a particular user-specified period of time. Operation of the method proceeds to Step S4400.

In Step S4400, collected data regarding use of each of the plurality of common use (output) devices in the operating environment may be mapped in a form usable for a system operator, or for an automated scheme, to analyze. Operation of the method proceeds to Step S4500.

In Step S4500, an optimization scheme may be undertaken manually or automatically according to known methods to determine or confirm an optimal placement for at least one of the plurality of existing common use (output) devices in the operating environment, or otherwise specify an optimal positioning for one or more common use (output) devices to be added to the operating environment. Operation of the method proceeds to Step S4600.

In Step S4600, at least one of a map of the collected data regarding the use of each of the plurality of common use (output) devices in the operating environment or a placement plan generated based on the optimizing of the placement of the existing common use devices, or the one or more added common use devices, may be output to a user. Such output may be in the form of being displayed on a common digital display device, or being printed as a hard copy output from one of the common use (output) devices, or otherwise. Operation of the method proceeds to Step S4700, where operation of the method ceases.

The above-described exemplary systems and methods reference certain conventional components to provide a brief, general description of suitable common use (output) devices and networked environments that may be particularly adaptable to optimization according to the systems and methods described. Those skilled in the art will appreciate that other embodiments of the disclosed subject matter may be practiced with many types of output image forming systems, analysis tools, and networked environments in many different configurations.

The exemplary depicted sequence of executable instructions represents one example of a corresponding sequence of acts for implementing the functions described in the steps. The exemplary depicted steps may be executed in any reasonable order to carry into effect the objectives of the disclosed embodiments. No particular order to the disclosed steps of the method is necessarily implied by the depiction in FIG. 4, and the accompanying description, except where a particular method step is a necessary precondition to execution of any other method step. Individual method steps may be carried out in sequence or in parallel in simultaneous or near simultaneous timing.

Although the above description may contain specific details, they should not be construed as limiting the claims in any way. Other configurations of the described embodiments of the disclosed systems and methods are part of the scope of this disclosure.

It will be appreciated that a variety of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method for determining placement of devices in an operating environment, comprising:
   automatically collecting data on user employment of the devices in the operating environment, the collected data being affinity data that provides an indication of users' employment of one of the devices in relation to the users' employment of others of the devices;
   mapping, with a processor, the collected data specifying the devices and an indication of relative use of the devices;
   analyzing the mapping with the processor to determine placement of one or more of the devices in the operating environment; and
   outputting a result of the analysis to an operator for use in placing the devices,
   the result of the analysis being displayed in a format in which the devices are represented as individual nodes and the indication of the relative use of the devices is indicated by lines between related devices, at least one of a color and a thickness of the lines representing a level of the relative use.

2. The method of claim 1, the devices being devices commonly used by a plurality of users in the operating environment.

3. The method of claim 1, further comprising:
   obtaining a layout map of the operating environment;
   annotating the obtained layout map with a position of the devices in the operating environment;
   updating the layout map as a result of the analyzing to indicate the determined placement of the one or more devices in the operating environment; and
   outputting the updated layout map in a form usable to the operator.

4. The method of claim 1, the analyzing the mapping with the processor further comprising defining a plurality of zones for the placement of one or more of the devices in the operating environment.

5. The method of claim 1, further comprising specifying, by the operator, at least one of a subset of less than all of the devices in the operating environment for which the user data is collected, and a timeframe for which the user data is collected.

6. The method of claim 1, the analyzing of the mapping with the processor to determine placement of one or more of the devices in the operating environment comprising:
   referencing user locations within the operating environment; and
   optimizing placement of the one or more devices based on a relative proximity of the one or more devices to the user locations for a plurality of users that employ the one or more of the devices.

7. The method of claim 1, the analyzing of the mapping with the processor to determine placement of one or more of the devices in the operating environment comprising referencing limitations on user access to a particular zone or a particular portion of a zone.

8. The method of claim 1, the analyzing of the mapping with the processor to determine placement of one or more of the devices in the operating environment comprising referencing limitations on placement of a particular device or a particular class of devices in a particular zone or a particular portion of a zone.

9. The method of claim 1, the outputting the result of the analysis to the operator comprising at least one of displaying the result on a display device or forming an image of the result on an output image receiving substrate.

10. A system for determining placement of devices in an operating environment, comprising:
    a data collection device that is configured to automatically collect data via an external data communication interface on user employment of the devices in the operating environment, the collected data being affinity data that provides an indication of users' employment of one of the devices in relation to the users' employment of others of the devices;
    a processor that is programmed to:
      map the collected data specifying the devices and an indication of relative use of the devices; and
      analyze the mapping to determine placement of one or more of the devices in the operating environment; and
    a display device for displaying a result of the analysis to an operator, the display device displaying the result of the analysis in a format in which the devices are represented as individual nodes and relations between the devices are indicated by lines between related devices, at least one of a color or a thickness of the lines representing a level of the relations.

11. The system of claim 10, further comprising:
a data storage device storing a layout map for the operating environment,
the processor being further programmed to:
- access the stored layout map;
- annotate the accessed layout map with a position of the devices in the operating environment; and
- update the layout map as a result of the analyzing to indicate the determined placement of the one or more of the devices in the operating environment the display device displaying the updated layout map in a form usable to the operator.

12. The system of claim 10, further comprising a user input interface by which the operator specifies at least one of a subset of less than all of the devices in the operating environment for which the user data is collected and a timeframe for which the user data is collected.

13. The system of claim 10, the processor being further programmed to reference user locations within the operating environment to optimize placement of the one or more devices based on a relative proximity of the one or more devices to the user locations for a plurality of users that employ the one or more devices.

14. The system of claim 10, the processor being further programmed to determine placement of one or more of the devices in the operating environment by referencing at least one of (1) limitations on user access to a particular zone or a particular portion of a zone and (2) limitations on placement of a particular device or a particular class of devices in a particular zone or a particular portion of a zone.

15. The system of claim 10, further comprising an output device that forms an image of the result on an output image receiving substrate.

16. A non-transitory computer-readable medium storing instructions which, when executed by a processor, cause the processor to execute a method for determining placement of devices in an operating environment, the method comprising:
- automatically collecting data on user employment of the devices in the operating environment, the collected data being affinity data that provides an indication of users' employment of one of the devices in relation to the users' employment of others of the devices;
- mapping the collected data specifying the devices and an indication of relative use of the devices;
- analyzing the mapping to determine placement of one or more of the devices in the operating environment; and
- outputting a result of the analysis to an operator for use in placing the devices, the result of the analysis being displayed in a format in which the devices are represented as individual nodes and the indication of the relative use of the devices is indicated by lines between related devices, at least one of a color and a thickness of the lines representing a level of the relative use.

* * * * *